United States Patent
Sasaki

(10) Patent No.: US 8,299,766 B2
(45) Date of Patent: Oct. 30, 2012

(54) SWITCHING OUTPUT CIRCUIT

(75) Inventor: Yoshikazu Sasaki, Kyoto (JP)

(73) Assignee: Rohm Co., Ltd. (JP)

( * ) Notice: Subject to any disclaimer, the term of this patent is extended or adjusted under 35 U.S.C. 154(b) by 434 days.

(21) Appl. No.: 12/709,859

(22) Filed: Feb. 22, 2010

(65) Prior Publication Data
US 2010/0231270 A1   Sep. 16, 2010

(30) Foreign Application Priority Data

Feb. 20, 2009 (JP) ................... 2009-038635
Jan. 18, 2010 (JP) ................... 2010-008369

(51) Int. Cl.
*G05F 1/40* (2006.01)
*H02M 7/5387* (2007.01)

(52) U.S. Cl. ........ 323/271; 323/282; 323/285; 363/132; 363/133

(58) Field of Classification Search .............. 323/271, 323/282–285, 351; 363/132–134
See application file for complete search history.

(56) References Cited

U.S. PATENT DOCUMENTS

| | | | |
|---|---|---|---|
| 7,294,992 B2* | 11/2007 | Yoshikawa | 323/222 |
| 7,564,704 B2* | 7/2009 | Rozsypal et al. | 363/56.1 |
| 7,683,594 B2* | 3/2010 | Kim et al. | 323/282 |
| 2007/0019450 A1* | 1/2007 | Tiew et al. | 363/98 |

FOREIGN PATENT DOCUMENTS
JP   8-84057 A   3/1996
* cited by examiner

*Primary Examiner* — Jessica Han
(74) *Attorney, Agent, or Firm* — Cantor Colburn LLP

(57) ABSTRACT

A high-side transistor and a low-side transistor each has gate electrodes configured so as to allow signals to be input and output via a driving contact and a detection contact provided at different positions. When a control signal is at a first level and a signal output from the detection contact on the low-side transistor side is at a low level, the high-side driver applies a low-level signal to the driving contact on the high-side transistor side. When the control signal is at a second level and a signal output from the detection contact on the high-side transistor side is at a high level, the low-side driver applies a high-level signal to the driving contact on the low-side transistor side.

12 Claims, 4 Drawing Sheets

SWITCHING OUTPUT CIRCUIT

BACKGROUND OF THE INVENTION

1. Field of the Invention

The present invention relates to a switching output circuit including a high-side transistor and a low-side transistor connected in a push-pull manner.

2. Description of the Related Art

Driving circuits for inverters configured to drive a switching regulator or a discharge lamp, or driving circuits for a motor, include a switching output circuit such as a half-bridge circuit, an H-bridge circuit, or the like. The switching output circuit includes a high-side transistor and a low-side transistor connected in series between a power supply terminal and a ground terminal. With such an arrangement, the high-side transistor and the low-side transistor are switched on and off in a complementary manner. The switching output circuit controls electric power to be supplied to a load or the like, by controlling the ON time of each transistor.

Such a switching output circuit has a problem in that, if the high-side transistor and the low-side transistor are switched on at the same time, shoot-through current flows from the power supply terminal to the ground terminal. In order to solve this problem, in general, with such a switching output circuit, a period is established in which both the high-side transistor and the low-side transistor are set to the OFF state (which will also be referred to as "dead time"), thereby preventing these two transistors from being switched on at the same time.

Related Art Documents
[Patent Documents]
[Patent Document 1]
  Japanese Patent Application Laid Open No. H8-84057

With a circuit described in Patent document 1, the timing at which the high-side transistor is switched on and the timing at which the low-side transistor is switched on are delayed so as to prevent shoot-through current.

Specifically, the following steps are executed.

1. High-side transistor control operation The signal (edge) used as an instruction to switch off the low-side transistor is delayed by a certain period Td. A logical operation is performed on the signal thus delayed and a signal used as an instruction to switch on the high-side transistor, and the high-side transistor is driven according to the signal obtained by means of the logical operation.

2. Low-side transistor control operation
A signal used as an instruction to switch off the low-side transistor is delayed. A logical operation is performed on the signal thus delayed and the signal used as an instruction to switch on the high-side transistor, and the low-side transistor is driven according to the signal obtained by means of the logical operation.

With such a method, the dead time is determined by the delay time Td. In general, the risk of shoot-through current can be reduced by increasing the dead time. However, such a method has a problem as follows. That is to say, in a case in which the switching output circuit is connected to an inductive load such as a coil, during the dead time, the inductive current that occurs at the coil flows through the body diode formed at each transistor that is in the OFF state. This increases current loss, which reduces the efficiency. Conversely, in a case in which the dead time is reduced, there is an increase in the period in which the inductive current that occurs at the coil flows through the channel of each transistor, and does not flow through the body diode thereof. This increases the circuit efficiency. However, such an arrangement leads to an increased risk of shoot-through current.

An arrangement in which the delay time Td is obtained using the CR time constant has a problem in that, in a case in which the power supply voltage for the circuit fluctuates, the delay time fluctuates, leading to fluctuation in the dead time. This problem can be solved by setting a margin for the delay time Td. However, it is not easy to design the required margin. Furthermore, such a margin can become a primary cause of circuit efficiency degradation. Moreover, in a case in which the high-side transistor and the low-side transistor are switched on and off with a high speed, there is a need to reduce the dead time. Accordingly, it is more difficult to design the delay time Td for such an arrangement.

SUMMARY OF THE INVENTION

The present invention has been made in view of such a situation. Accordingly, it is an exemplary purpose of an embodiment of the present invention to provide a switching output circuit which is capable of preventing a shoot-through current by means of an approach that differs from conventional techniques.

An embodiment of the present invention relates to a switching output circuit configured to output a first constant voltage or a second constant voltage according to a control signal. The switching output circuit comprises: a high-side transistor configured as a P-channel MOSFET (Metal Oxide Semiconductor Field Effect Transistor) provided between a first constant voltage terminal, to which a first constant voltage is applied, and a switching terminal; a low-side transistor configured as an N-channel MOSFET provided between a second constant voltage terminal, to which a second constant voltage which is lower than the first constant voltage is applied, and the switching terminal; and a pre-driver circuit configured to supply a first driving signal and a second driving signal to the gates of the high-side transistor and the low-side transistor, respectively, according to the control signal. The control signal is set to a first level in a period in which the high-side transistor is to be set to the ON state and the low-side transistor is to be set to the OFF state, and is set to a second level in a period in which the high-side transistor is to be set to the OFF state and the low-side transistor is to be set to the ON state. The gate electrodes of each of the high-side transistor and the low-side transistor are configured to allow signals to be input and output via a driving contact and a detection contact provided at different positions. The pre-driver circuit comprises a high-side driver and a low-side driver. The high-side driver is configured to apply a low-level signal to the driving contact on the high-side transistor side so as to switch the high-side transistor to the ON state when the control signal is at the first level and a signal output from the detection contact on the low-side transistor side is at the low level, and to apply a high-level signal to the driving contact on the high-side transistor side so as to switch the high-side transistor to the OFF state when the control signal is at the second level. The low-side driver is configured to apply a high-level signal to the driving contact on the low-side transistor side so as to switch the low-side transistor to the ON state when the control signal is at the second level and a signal output from the detection contact on the high-side transistor side is at the high level, and to apply a low-level signal to the driving contact on the low-side transistor side so as to switch the low-side transistor to the OFF state when the control signal is at the first level.

Where the high-side transistor and the low-side transistor (which are also referred to as "power transistors") are each large-sized, the operation of these transistors is as exemplified by a distribution constant circuit formed of gate capacitances and gate resistances. For example, if the high-side transistor is virtually partitioned into several blocks, the blocks are switched on and off at different timings. Specifically, the block nearest to the driving contact is switched on and off first. The timing at which the blocks are switched on and off is delayed as the distance becomes farther from the driving contact. That is to say, a block in the vicinity of the detection contact is driven later as compared with a block in the vicinity of the driving contact. Thus, by controlling the driving operation for the low-side transistor using a signal output from the detection contact on the high-side transistor side, such an arrangement ensures that the low-side transistor is switched on after all the blocks of the high-side transistor are switched off. Furthermore, such an arrangement ensures that the high-side transistor is switched on after all the blocks of the low-side transistor are switched off in the same way as with the low-side transistor.

Also, the high-side transistor and the low-side transistor may each include at least one gate electrode, having the driving contacts at both ends thereof, and the detection contact in the center area thereof.

Also, the high-side transistor and the low-side transistor may each include at least one gate electrode, having the driving contact at one end thereof and the detection contact at the other end thereof.

Also, the high-side transistor and the low-side transistor may each include at least one gate electrode, having the detection contact positioned such that a signal output from the detection contact is the last to be switched after a signal input to the driving contact is switched.

Also, the high-side driver may include a first logical gate configured to perform a logical operation on a signal that corresponds to the control signal and a signal output from the detection contact on the low-side transistor side. Also, the low-side driver may include a second logical gate configured to perform a logical operation on a signal that corresponds to the control signal and a signal output from the detection contact on the high-side transistor side.

Also, the switching output circuit according to an embodiment may further comprise: a first delay circuit configured to delay each positive edge of a signal output from the detection contact on the high-side transistor side; and a second delay circuit configured to delay each negative edge of a signal output from the detection contact on the low-side transistor side.

Another embodiment of the present invention relates to a switching regulator. The switching regulator comprises a switching output circuit according to any one of the above-described embodiments.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
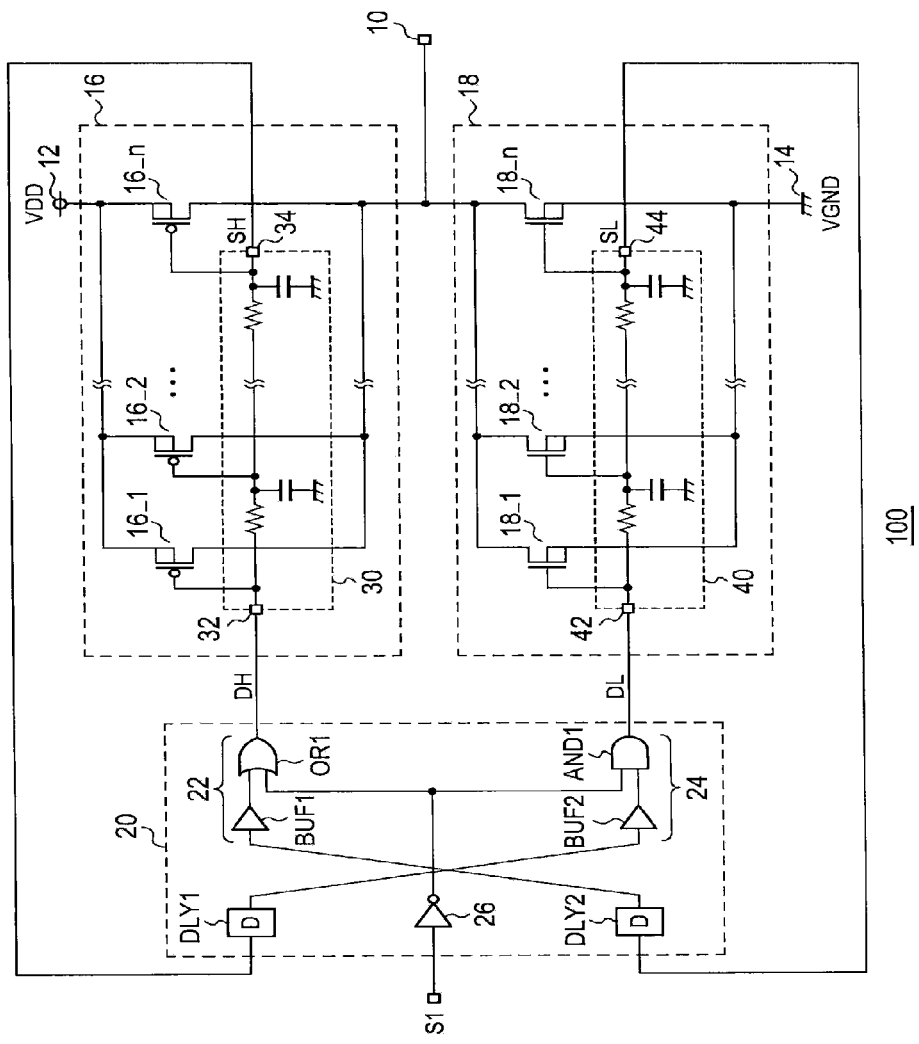
FIG. 1 is a circuit diagram which shows a configuration of a switching output circuit according to an embodiment.

FIG. 1 is a circuit diagram which shows a configuration of a switching output circuit 100 according to an embodiment. The switching output circuit 100 outputs either a first constant voltage (power supply voltage VDD) or a second constant voltage (ground voltage VGND) which is lower than the first constant voltage, via a switching terminal 10 according to a control signal S1. The switching output circuit 100 includes a high-side transistor 16, a low-side transistor 18, and a pre-driver circuit 20.

The high-side transistor 16 is a P-channel MOSFET (Metal Oxide Semiconductor Field Effect Transistor), and is provided between a first constant voltage terminal (power supply terminal), to which the power supply voltage VDD is applied, and the switching terminal 10.

The low-side transistor 18 is an N-channel MOSFET, and is provided between a second constant voltage terminal (ground terminal) 14, to which the ground voltage VGND is applied, and the switching terminal 10.

The control signal S1 exhibits a first level (high level) when the high-side transistor 16 is to be set to the ON state and the low-side transistor 18 is to be set to the OFF state. Furthermore, the control signal S1 exhibits a second level (low level) when high-side transistor 16 is to be set to the OFF state and the low-side transistor 18 is to be set to the ON state. The pre-driver circuit 20 supplies a first driving signal DH to the gate of the high-side transistor 16, and supplies a second driving signal DL to the gate of the low-side transistor 18, according to the control signal S1.

A gate electrode 30 of the high-side transistor 16 is configured such that signals can be input and output via a driving contact 32 and a detection contact 34, which are provided at different positions. The low-side transistor 18 is configured in the same manner, and a gate electrode 40 of the low-side transistor 18 is configured such that signals can be input and output via a driving contact 42 and a detection contact 44, which are provided at different positions. FIG. 1 shows only a single gate electrode 30 (40).

In actuality, multiple gate electrodes may be provided as described later.

The gate electrode 30 of the high-side transistor can be understood as a distribution constant circuit formed of gate capacitances and gate resistors. Furthermore, the high-side transistor 16 can be understood as being similar to an aggregation of multiple blocks 16_1 through 16_n (n is an integer) each of which corresponds to the electrical length from the output terminal of the pre-driver circuit 20. With such an arrangement, the state (ON/OFF state) of the block 16_1, which is the block nearest to the driving contact 32, changes first according to a change in the first driving signal DH, and the block 16_n, which is the block farthest from the driving contact 32, changes last according to a change in the first driving signal DH.

The detection contact 34 is provided in the block 16_n, which is positioned at a given distance from the driving contact 32. Preferably, the detection contact 34 is arranged in a block 16_m (m>n/2) which is farther from the driving contact 32 than the midpoint block. More preferably, the detection contact 32 is arranged in the farthest block 16_n.

The low-side transistor 18 side is configured in the same manner as the high-side transistor side 16.

The pre-drier circuit 20 includes a high-side driver 22 and a low-side driver 24.

When the control signal S1 is at the first level (high level) and the signal (which will be referred to as the "second detection signal" hereafter) SL output from the detection contact 44 on the low-side transistor 18 side is at the low level, the high-side driver 22 applies the first driving signal DH at the low level (e.g., the ground voltage VGND) to the driving contact 32 on the high-side transistor side, thereby turning on the high-side transistor 16. When the control signal S1 is at the second level (low level), the high-side driver 22 applies the first driving signal DH at the high level (e.g., the power supply voltage VDD) to the driving contact 32 on the high-side transistor 16 side, thereby turning off the high-side transistor 16.

In order to provide this function, the high-side driver 22 includes a first buffer BUF1 and a first logical gate OR1. A threshold value for determining the high level and the low level of the second detection signal SL is set for the first buffer BUF1, for example. A Schmitt buffer with a hysteresis function is preferably employed as the first buffer BUF1. The first logical gate OR1 generates the logical OR of the control signal S1# ("#" represents logical inversion) inverted by an inverter 26 and the output of the first buffer BUF1. The output signal of the first logical gate OR1 is supplied to the driving contact 32 as the first driving signal DH via an unshown buffer.

When the control signal S1 is at the second level (low level) and the signal (which will be referred to as the "first detection signal") SH output from the detection contact 34 on the high-side transistor 16 side is at the high level, the low-side driver 24 applies a second driving signal DL at the high level (e.g., power supply voltage VDD) to the driving contact 42 on the low-side transistor 18 side, thereby turning on the low-side transistor 18. On the other hand, when the control signal S1 is at the first level (high level), the low-side driver 24 applies the second driving signal DL at the low level (e.g., ground voltage VGND) to the driving contact 42 on the low-side transistor 18 side, thereby turning off the low-side transistor 18.

In order to provide this function, the low-side driver 24 includes a second buffer BUF2 and a second logical gate AND1, for example. A threshold value for determining the high level and the low level of the first detection signal SH is set for the second buffer BUF2. A Schmitt buffer is employed as the second buffer BUF2, in the same way as with the first buffer BUF1. The second logical gate AND1 generates the logical AND of the control signal S1# thus inverted and the output of the second buffer BUF2. The output signal of the second logical gate AND1 is supplied to the driving contact 42 as the second driving signal DL via an unshown buffer.

Figure 2:
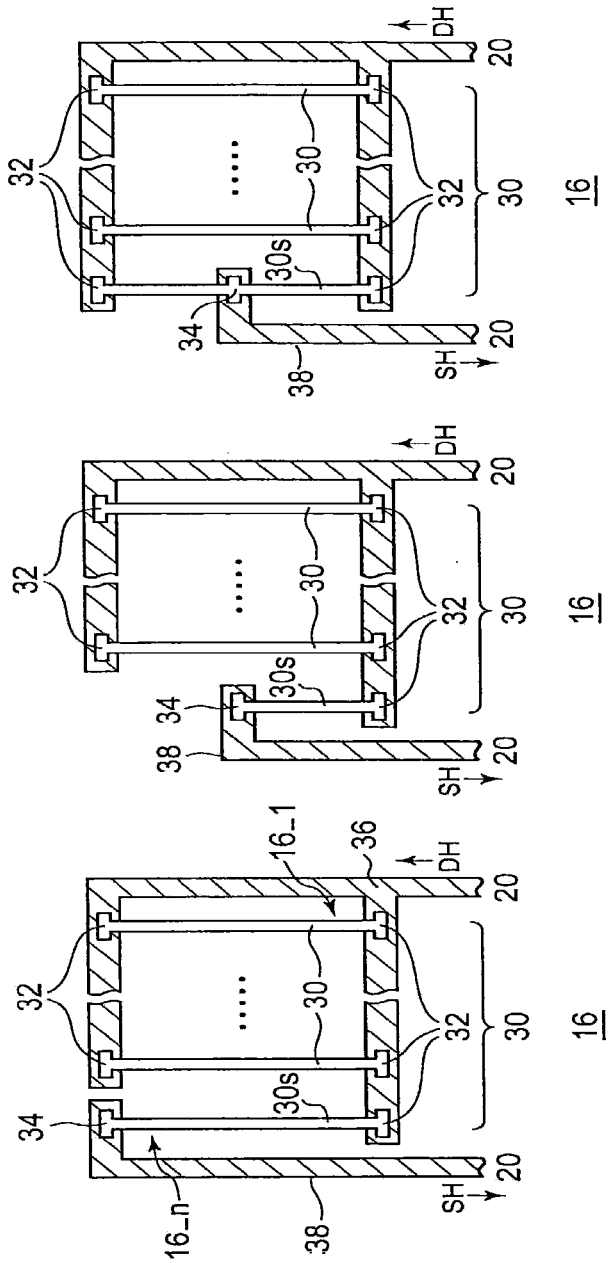
FIGS. 2A through 2C are diagrams which show exemplary layouts of gate wiring of a high-side transistor.

FIGS. 2A through 2C are diagrams that each show an exemplary layout of the gate wiring of the high-side transistor 16. Multiple gate electrodes 30 are formed on a rectangular gate oxide film that spans the entire area of the high-side transistor 16.

In FIG. 2A, a driving contact 32 is provided to at least one end of each gate electrode 30, and each gate electrode 30 is connected to a metal wiring line 36 via the driving contact 32. The first detection signal SH output from the pre-driver circuit 20 is applied to the metal wiring line 36.

At least one of the multiple gate electrodes 30 functions as a detection gate electrode 30s. The detection gate electrode 30s includes the driving contact 32 at one end thereof, and is connected to the metal wiring line 36. Furthermore, the detection contact 34 is included at the other end of the detection gate electrode 30s. The detection contact 34 is connected to a metal wiring line 38. The first detection signal SH output from the detection contact 34 is output to the pre-driver circuit 20. The propagation delay, which is the length of time required for the first driving signal DH input to the high-side transistor 16 to reach the detection contact 34, will be represented by τH (τL on the low-side transistor side).

With such a configuration, the first driving signal DH input to the high-side transistor 16 propagates through each block of the high-side transistor 16 via the metal wiring line 36 and the gate electrodes 30 and 30s. Accordingly, the block that is electrically nearest to the output terminal of the pre-driver circuit 20 corresponds to the block 16_1 shown in FIG. 1, and the block where the detection contact 34 is provided is electrically farthest from the output terminal, and corresponds to the block 16_n shown in FIG. 1.

As shown in FIG. 2B, the length of the detection gate electrode 30s can be optimized based upon the gate resistance and the gate capacitance of the gate electrodes 30. In general, it is often the case that the delay that occurs in the metal wiring is sufficiently small in comparison to the delay that occurs in the gate electrodes 30. Accordingly, it can be assumed that the first driving signal DH reaches the multiple driving contacts 32 at the same time. Accordingly, the first driving signal DH is thus the last to arrive at the middle area of each gate electrode 30. In this case, the detection contact 34 formed at a position shown in FIG. 2B corresponds to the block 16_n shown in FIG. 1.

As the electrical length between the output terminal of the pre-driver circuit 20 and the detection contact 34 is made longer, the shoot-through current risk can be reduced, but efficiency declines. By optimizing the length of the gate electrode 30a, such an arrangement provides a suitable balance between reduced shoot-through current risk and improved efficiency as compared with the layout shown in FIG. 2A.

In FIG. 2C, driving contacts 32 are included at both ends of the detection gate electrode 30s, and the detection contact 34 is included in the center area of the detection gate electrode 30s.

It should be noted that, in FIGS. 2A through 2C, the detection contact 34 is provided to the gate electrode 30 among the multiple gate electrodes 30 that is farthest from the point where the first driving signal DH is input, thereby providing the detection gate electrode 30s. This ensures that the position of the detection contact 34 is farthest from the output terminal of the pre-driver circuit 20. It should be noted that the present invention is not restricted to such an arrangement. Also, the detection contact 34 may be provided to the gate electrode 30 formed in the center area, or may be provided to one of the other gate electrodes 30. Also, the number of detection contacts 34 is not restricted to one. Also, multiple detection contacts 34 may be provided.

Figure 3:
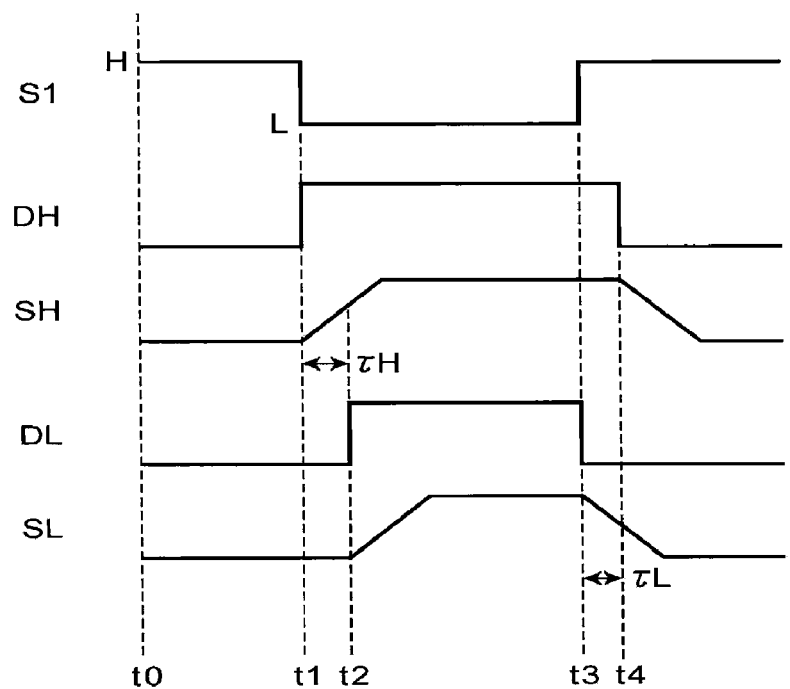
FIG. 3 is a time chart which shows the operation of the switching output circuit shown in FIG. 1.

The above is the configuration of the switching output circuit 100. Next, description will be made regarding the operation thereof. FIG. 3 is a time chart which shows the operation of the switching output circuit 100 shown in FIG. 1. At the time point t0, the control signal S1 is at the first level (high level), and the first driving signal DH and the first detection signal SH are at the low level, and accordingly, the high-side transistor 16 is in the ON state. Furthermore, the second driving signal DL and the second detection signal SL are at the low level, and accordingly, the low-side transistor 18 is in the OFF state.

At the time point t1, the control signal S1 is switched to the low-level state. Upon receiving this control signal S1, the pre-driver circuit 20 switches the first driving signal DH to the high-level state. As a result, the block 16_1, which is the block nearest to the driving contact 32, is immediately switched off. The first driving signal DH propagates through the gate electrodes 30 with the passage of time. The first detection signal SH output from the detection contact 34 is switched to the high-level state after the propagation delay τH due to the gate electrode 30. In this stage, the block 16_n is switched off, i.e., almost all the blocks of the high-side transistor 16 are switched off.

When the first detection signal SH crosses the threshold set for the second buffer BUF2 at the time point t2, the pre-driver circuit 20 switches the second driving signal DL to the high-level state. As a result, the block 18_1 of the low-side transistor 18 is switched to the ON state. The second driving signal DL propagates through the gate electrodes 40 with the passage of time. Subsequently, all the blocks of the low-side transistor 18 are switched to the ON state.

At the time point t3, the control signal S1 is switched to the high-level state. Upon receiving this control signal S1, the pre-driver circuit 20 switches the second driving signal DL to the low-level state. As a result, the block 18_1, which is the block nearest to the driving contact 42 of the low-side transistor 18, is switched off.

The second driving signal DL propagates through the gate electrodes 40 with the passage of time. The second detection signal SL output from the detection contact 44 is switched to the low-level state after the propagation delay τL. In this stage, the block 18_n is switched off, i.e., almost all the blocks of the low-side transistor 18 are switched off.

When the second detection signal SL crosses the threshold set for the first buffer BUF1 at the time point t4, the pre-driver circuit 20 switches the first driving signal DH to the high-level state. As a result, the block 16_1 of the high-side transistor 16 is switched to the ON state. The first driving signal DH propagates through the gate electrodes 30 with the passage of time. Subsequently, all the blocks of the high-side transistor 16 are switched to the ON state.

The switching output circuit 100 repeatedly performs the aforementioned operation.

With the switching output circuit 100 shown in FIG. 1, dead time can be generated based upon the propagation time τH due to the gate electrodes 30 and the propagation time τL due to the gate electrode 40. By arranging the detection contact 34 at a suitable position, such an arrangement ensures that the low-side transistor 18 is switched on after all the blocks 16_1 through 16_n on the high-side transistor 16 side are switched off. This means that such an arrangement enables the switching output circuit 100 shown in FIG. 1 to reliably prevent shoot-through current at the timing at which the low-side transistor 18 is switched on. The same can be said of the timing at which the high-side transistor 16 is switched on, thereby preventing shoot-through current.

With the switching output circuit 100, there is no need to set a margin for the dead time, unlike conventional techniques. Alternatively, with the switching output circuit 100, the margin set for the dead time can be reduced. In a case in which the pulse width of the control signal S1 is actively changed (e.g., pulse width modulation), the minimum width and the maximum width of the pulse are limited by the dead time. From this point of view, with the switching output circuit 100 according to the embodiment, the dead time can be reduced as compared with conventional techniques, thereby increasing the possible range of pulse width variation.

The effect of the switching output circuit 100 according to the embodiment can be more clearly understood in comparison with the following conventional technique.

With the comparative technique, the detection contacts 34 and 44 shown in FIG. 1 are not provided, but instead, the signal input to the driving contact 32 is input to the second buffer BUF2, and the signal input to the driving contact 42 is input to the first buffer BUF1. Description will be made regarding the operation of such an arrangement when the low-side transistor 18 is switched from the OFF state to the ON state. In this case, the second driving signal DL switches to the high-level state after only the block 16_1, which is the block nearest to the driving contact 32 on the high-side transistor 16 side, is switched off, and before the other blocks, i.e., the blocks 16_2 through 16_n, are switched off. This leads to a situation in which the low-side transistor 18 and the blocks 16_2 through 16_n are in the ON state at the same time, resulting in a high risk of shoot-through current. Accordingly, there is a need to provide a delay circuit on each input side of the first buffer BUF1 and the second buffer BUF2, and to optimize their delay amounts, leading to a heightened degree of difficulty in the design.

On the other hand, with the switching output circuit 100 shown in FIG. 1, the detection contacts 34 and 44 are provided, and the first detection signal SH and the second detection signal SL are fed back to the pre-driver circuit 20, thereby reliably preventing the high-side transistor and the low-side transistor from being switched on at the same time.

It should be noted that the switching output circuit 100 shown in FIG. 1 including the detection contacts 34 and 44 may further include: a first delay circuit DLY, as the input stage of the second buffer BUF2, which is configured to delay each positive edge of the first detection signal SH output from the detection contact 34 on the high-side transistor 16 side; and a second delay circuit DLY2, as the input stage of the first buffer BUF1, which is configured to delay each negative edge of the second detection signal SL output from the detection contact 44 on the low-side transistor 18 side. Optimizing the positions of the detection contacts 33 and 34 is sufficient to prevent shoot-through current, without involving these delay circuits DLY1 and DLY2. However, such an arrangement including these delay circuits DLY1 and DLY2 provides the following advantage. That is to say, the propagation delays τH and τL that occur in the gate electrodes 30 and 40 are fixed when the switching output circuit 100 is manufactured, and accordingly, the dead time cannot be changed. On the other hand, an arrangement including the delay circuits DLY1 and DLY2 allows the dead time to be adjusted after the switching output circuit 100 is manufactured.

Next, description will be made regarding an application of the switching output circuit 100 according to an embodiment.

Figure 4:
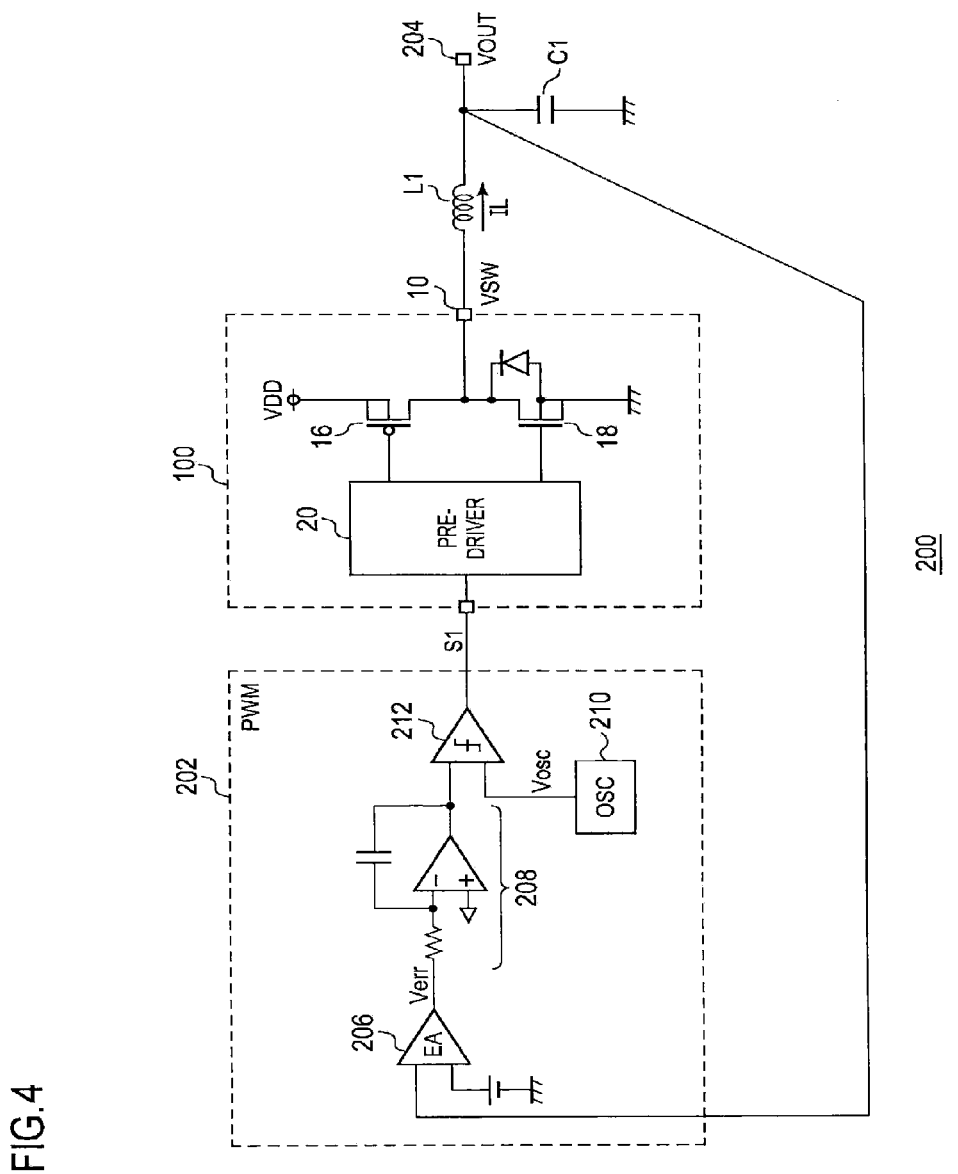
FIG. 4 is a circuit diagram which shows a switching regulator employing the switching output circuit shown in FIG. 1.

FIG. 4 is a circuit diagram which shows a switching regulator 200 employing the switching output circuit 100 shown in FIG. 1. The switching regulator 200 is a step-down switching regulator, and includes the switching output circuit 100 shown in FIG. 1, a pulse width modulator 202, a coil L1, and a capacitor C1. The switching output circuit 100 lowers the input voltage VDD, and outputs the voltage thus lowered via an output terminal 204. The voltage at the output terminal 204 (output voltage VOUT) is fed back to the pulse width modulator 202.

The pulse width modulator 202 adjusts the duty ratio of the control signal S1 such that the output voltage VOUT approaches the target value. The switching output circuit 100 switches the high-side transistor 16 and the low-side transistor 18 in a complementary manner according to the control signal S1 output from the pulse width modulator 202, and supplies a switching voltage VSW to one terminal of the coil L1.

The pulse width modulator 202 includes an error amplifier 206, an integrator 208, an oscillator 210, and a PWM comparator 212. The error amplifier 206 amplifies the difference between a reference voltage Vref and the output voltage VOUT. The integrator 208 integrates the error voltage Verr output from the error amplifier 206. The oscillator 210 generates a triangle wave or sawtooth wave cyclic signal Vosc. The PWM comparator 212 makes a comparison between the cyclic signal Vosc and the output signal of the integrator 208 so as to generate the control signal S1. It should be noted that the configuration of the pulse width modulator 202 is not restricted to the configuration shown in FIG. 4.

The switching regulator shown in FIG. 4 is capable of preventing the shoot-through current. Thus, such an arrangement reduces power consumption, and provides the stable operation.

With the switching regulator, in the dead time period, the coil current IL flows through the coil L1 via the body diode of the low-side transistor 18, not via the channel of the low-side transistor 18. The resistance component of the body diode is greater than the resistance component of the channel. Accordingly, as the dead time lengthens, efficiency is reduced. With the switching regulator 200 shown in FIG. 4, the dead time can be reduced as compared with conventional techniques, thereby improving the efficiency.

Furthermore, such an arrangement is capable of increasing the range of possible pulse width variation for the pulse width modulated control signal S1, as compared with conventional techniques. This offers the advantage of increasing the output voltage range.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

The settings of the logical values of the logical signals used in the switching output circuit 100, such as the high-level state and the low-level state of the logical signals, have been described in the embodiment for exemplary purposes only. Also, the signal levels may be freely inverted as appropriate.

Description has been made in the embodiment regarding the step-down switching regulator as an application of the switching output circuit 100. However, the present invention is not restricted to such an application. Also, the present invention can be applied to other switching regulators with different topologies. Alternatively, the present invention can be suitably applied to other systems employing a half-bridge circuit or an H-bridge circuit, such as inverters for a discharge lamp, motor drivers, etc.

While the preferred embodiments of the present invention have been described using specific terms, such description is for illustrative purposes only, and it is to be understood that changes and variations may be made without departing from the spirit or scope of the appended claims.

What is claimed is:

1. A switching output circuit comprising:
   a high-side transistor configured as a P-channel MOSFET (Metal Oxide Semiconductor Field Effect Transistor) provided between a first constant voltage terminal, to which a first constant voltage is applied, and a switching terminal;
   a low-side transistor configured as an N-channel MOSFET provided between a second constant voltage terminal, to which a second constant voltage which is lower than the first constant voltage is applied, and the switching terminal; and
   a pre-driver circuit configured to receive a control signal which is set to a first level in a period in which the high-side transistor is to be set to the ON state and the low-side transistor is to be set to the OFF state, and which is set to a second level in a period in which the high-side transistor is to be set to the OFF state and the low-side transistor is to be set to the ON state, and to supply a first driving signal and a second driving signal to the gates of the high-side transistor and the low-side transistor, respectively, according to the control signal,
   wherein gate electrodes of each of the high-side transistor and the low-side transistor are configured to allow signals to be input and output via a driving contact and a detection contact provided at different positions,
   and wherein the pre-driver circuit comprises
      a high-side driver configured to apply a low-level signal to the driving contact on the high-side transistor side so as to switch the high-side transistor to the ON state when the control signal is at the first level and a signal output from the detection contact on the low-side transistor side is at the low level, and to apply a high-level signal to the driving contact on the high-side transistor side so as to switch the high-side transistor to the OFF state when the control signal is at the second level; and
      a low-side driver configured to apply a high-level signal to the driving contact on the low-side transistor side so as to switch the low-side transistor to the ON state when the control signal is at the second level and a signal output from the detection contact on the high-side transistor side is at the high level, and to apply a low-level signal to the driving contact on the low-side transistor side so as to switch the low-side transistor to the OFF state when the control signal is at the first level.

2. A switching output circuit according to claim 1, wherein the high-side transistor and the low-side transistor each include at least one gate electrode, having the driving contacts at both ends thereof, and the detection contact in the center area thereof.

3. A switching output circuit according to claim 2, further comprising:
   a first delay circuit configured to delay each positive edge of a signal output from the detection contact on the high-side transistor side; and a second delay circuit configured to delay each negative edge of a signal output from the detection contact on the low-side transistor side.

4. A switching output circuit according to claim 1, wherein the high-side transistor and the low-side transistor each include at least one gate electrode, having the driving contact at one end thereof and the detection contact at the other end thereof.

5. A switching output circuit according to claim 4, further comprising:
a first delay circuit configured to delay each positive edge of a signal output from the detection contact on the high-side transistor side; and
a second delay circuit configured to delay each negative edge of a signal output from the detection contact on the low-side transistor side.

6. A switching output circuit according to claim 1, wherein the high-side transistor and the low-side transistor each include at least one gate electrode having the detection contact positioned such that a signal output from the detection contact is the last to be switched after a signal input to the driving contact is switched.

7. A switching output circuit according to claim 6, further comprising:
a first delay circuit configured to delay each positive edge of a signal output from the detection contact on the high-side transistor side; and
a second delay circuit configured to delay each negative edge of a signal output from the detection contact on the low-side transistor side.

8. A switching output circuit according to claim 1, wherein the high-side driver includes a first logical gate configured to perform a logical operation on a signal that corresponds to the control signal and a signal output from the detection contact on the low-side transistor side,
and wherein the low-side driver includes a second logical gate configured to perform a logical operation on a signal that corresponds to the control signal and a signal output from the detection contact on the high-side transistor side.

9. A switching output circuit according to claim 8, further comprising:
a first delay circuit configured to delay each positive edge of a signal output from the detection contact on the high-side transistor side; and
a second delay circuit configured to delay each negative edge of a signal output from the detection contact on the low-side transistor side.

10. A switching output circuit according to claim 1, further comprising:
a first delay circuit configured to delay each positive edge of a signal output from the detection contact on the high-side transistor side; and
a second delay circuit configured to delay each negative edge of a signal output from the detection contact on the low-side transistor side.

11. A switching regulator comprising a switching output circuit according to claim 1.

12. A switching regulator configured to generate a stabilized output voltage, and to output the output voltage thus generated via an output terminal, the switching regulator comprising:
an error amplifier configured to amplify the difference between the output voltage and a predetermined reference voltage;
an integrator configured to integrate the output signals of the error amplifier;
an oscillator configured to generate one of a triangle wave cyclic signal and a sawtooth wave cyclic signal;
a comparator configured to make a comparison between the cyclic signal and the output signal of the integrator so as to output a pulse width modulated control signal;
a switching output circuit according to claim 1, configured to receive the control signal;
an output capacitor provided between the output terminal and a ground terminal; and
a coil provided between the switching terminal of the switching output circuit and the output terminal.

* * * * *